United States Patent
Götz et al.

(10) Patent No.: US 10,980,103 B2
(45) Date of Patent: Apr. 13, 2021

(54) COOLING OF POWER ELECTRONICS CIRCUITS

(71) Applicant: Dr. Ing. h.c. F. Porsche Aktiengesellschaft, Stuttgart (DE)

(72) Inventors: Stefan Götz, Forstern (DE); Eduard Specht, Bruchsal (DE)

(73) Assignee: Dr. Ing. h.c. F. Porsche Aktiengesellschaft

( * ) Notice: Subject to any disclaimer, the term of this patent is extended or adjusted under 35 U.S.C. 154(b) by 30 days.

(21) Appl. No.: 16/366,255

(22) Filed: Mar. 27, 2019

(65) Prior Publication Data
US 2019/0335577 A1    Oct. 31, 2019

(30) Foreign Application Priority Data
Apr. 25, 2018    (DE) .......................... 102018109920.7

(51) Int. Cl.
*H05K 1/02* (2006.01)
*H05K 1/18* (2006.01)
*H05K 7/20* (2006.01)

(52) U.S. Cl.
CPC .......... *H05K 1/0204* (2013.01); *H05K 1/181* (2013.01); *H05K 7/20927* (2013.01); *H05K 7/205* (2013.01); *H05K 7/20254* (2013.01); *H05K 7/20509* (2013.01); *H05K 2201/064* (2013.01); *H05K 2201/10015* (2013.01); *H05K 2201/10522* (2013.01)

(58) Field of Classification Search
CPC ...... H05K 7/20; H05K 7/205; H05K 7/20254; H05K 7/20436; H05K 7/20472; H05K 7/2029; H05K 7/20309–20318; H05K 7/2039; H05K 7/20927; H05K 1/0203–0204; H05K 1/181; H05K 1/0204–0206; H05K 1/021–0212; H05K 2201/064; H05K 2201/066; H05K 2201/06; H05K 2201/10015; H05K 2201/10416; H05K 2201/10522; G06F 1/20; G06F 1/203; G06F 2200/201
USPC ........................ 361/709–712, 715, 718–719; 165/80.2–80.5, 104.21, 104.33; 174/252, 174/547–548; 257/712–722
See application file for complete search history.

(56) References Cited

U.S. PATENT DOCUMENTS

| | | | |
|---|---|---|---|
| 5,214,309 A | 5/1993 | Saarnimo | |
| 5,812,374 A * | 9/1998 | Shuff | H05K 7/20545 165/185 |
| 9,496,799 B2 | 11/2016 | Goetz | |
| 2001/0038310 A1 | 11/2001 | Olofsson et al. | |

(Continued)

*Primary Examiner* — Zachary Pape
*Assistant Examiner* — Amir A Jalali
(74) *Attorney, Agent, or Firm* — RatnerPrestia

(57) ABSTRACT

A method for cooling power electronics circuits, in which a printed circuit board is produced according to a prescribed circuit board process and is populated with at least one power electronics components. Contact connecting at least one location on at least one metallic conductor track running on a surface of the printed circuit board that includes at least one metal element, which is both electrically conductive and heat-conductive and the physical height of which is designed to be at least as large as that of the at least one power electronics component. A cooling plate is placed in a planar manner onto the at least one power electronics component and/or the at least one metal element.

18 Claims, 11 Drawing Sheets

(56) References Cited

U.S. PATENT DOCUMENTS

| | | | |
|---|---|---|---|
| 2002/0047193 A1* | 4/2002 | Dorfler | H05K 1/0207 257/687 |
| 2008/0128116 A1* | 6/2008 | Dangelo | H01L 23/373 165/104.21 |
| 2012/0236500 A1 | 9/2012 | Higuchi et al. | |
| 2013/0027883 A1* | 1/2013 | Campbell | H05K 7/20318 361/700 |
| 2013/0208422 A1* | 8/2013 | Neville | H05K 7/20318 361/700 |
| 2015/0011052 A1* | 1/2015 | Haba | H01L 24/81 |
| 2015/0181698 A1* | 6/2015 | Suganuma | H05K 1/181 250/208.1 |
| 2016/0242313 A1* | 8/2016 | Singh | H05K 3/0061 |
| 2017/0071074 A1* | 3/2017 | Matheson | H05K 9/0049 |
| 2018/0014373 A1* | 1/2018 | Song | H05K 3/4608 |
| 2018/0143671 A1* | 5/2018 | Lee | H01L 23/427 |
| 2018/0175011 A1* | 6/2018 | Sung | H01L 23/5381 |
| 2020/0068700 A1* | 2/2020 | Ma | H05K 1/0206 |
| 2020/0111721 A1* | 4/2020 | Park | H01L 24/33 |

* cited by examiner

COOLING OF POWER ELECTRONICS CIRCUITS

CROSS-REFERENCE TO RELATED APPLICATION

This application claims priority to German Patent application No. DE 10 2018 109 920.7, filed Apr. 25, 2018, which is incorporated by reference herein in its entirety.

FIELD OF THE INVENTION

The present invention relates to a method for cooling power electronics circuits, in which at least one conductor track on a printed circuit board is designed with respect to possibilities for dissipating heat. A printed circuit board designed in such a way is also described herein.

BACKGROUND OF THE INVENTION

Conventional power electronics systems are usually implemented with discrete electrical components, for example thyristors and IGBTs, shortened by those skilled in the art for insulated-gate bipolar transistors, with screw connections and busbars. In contrast, recent power transistors permit integration of high-power circuits into typical circuit boards. However, with typical metal thicknesses of 35 µm, such circuit boards, denoted by those skilled in the art as printed circuit boards or PCBs, are not capable of conducting high currents or absorbing the waste heat thereof.

Modern modular power electronics systems, such as, for example, the modular multi-level converter described in US document U.S. Pat. No. 9,496,799 B2, which is incorporated by reference herein, break down high powers into smaller proportions that can be switched by the low-voltage semiconductors comprised by said multi-level converters. However, it is necessary to conduct said high powers and currents onto printed circuit boards with said modern power electronics systems.

Furthermore, modern, rapidly switching power semiconductors require very compact circuit implementations in order to be able to use their speed. In the background are, in particular, the high parasitic inductances, which result in the case of a physically large circuit design. Magnetic energy stored in the parasitic inductances can undesirably be discharged in switching processes and generate undesirable switching overvoltages, which damage or destroy components. However, printed circuit boards from the prior art contain a plurality of layers of thick copper, as a result of which large printed circuit board thicknesses are achieved. Components that are usually connected to the topmost and bottommost layer thus have a large spacing from one another, as a result of which the area spanned by the current and hence the parasitic inductances increase enormously.

U.S. Pat. No. 5,214,309, which is incorporated by reference herein, discusses a circuit board with a thick metal piece for deflecting heat from a power transistor.

While conventional circuit boards are generally manufactured with a certain number of copper layers with a thickness of approximately 35 µm to 70 µm, the prior art now knows of options for manufacturing printed circuit boards with some layers of 400 µm and more using very similar production methods. Like in standard printed circuit boards, the copper layer is deposited in a fully electrolytic (galvanic) manner or is laminated as a metal film, then coated (positively or negatively) with a photoresist, this is exposed positively or negatively with the corresponding pattern, developed and then partially removed, in order to then etch, in a wet chemical manner, the surfaces no longer covered by photoresist. However, the etching of copper is substantially isotropically unidirectional and therefore also etches from the side into the copper areas still covered by photoresist. The resolution of the possible structures therefore decreases with the layer thickness. Otherwise, nearly all established methods can be used in the production in order, for example, to locally connect different layers of the circuit boards through vies. High-current paths on the printed circuit board are formed in the prior art, for example, with vertically arranged busbars. Said busbars are usually mounted using through-hole technology, wherein surface-mounted device or SMD technology is also conceivable.

Since the etching of thick copper is usually limited to layer thicknesses of considerably below one millimeter, so-called inlays are often produced for higher thicknesses of a few millimeters. Inlays are cut from copper according to the required shape and then embedded in a circuit board. The inlay is generally inserted in an inner layer of the circuit board. The empty spaces that result at the level of the inserted solid copper elements have to be filled with material, generally preimpregnated fibers.

In the prior art, circuit boards for SMD semiconductors at the surface are provided only with an inlay level and possibly some, usually etched, printed circuit board layers lying above or below said inlay level, but in this case overlapping current paths cannot be realized. In this case, it is conceivable to embed a plurality of inlay layers, but there is the problem that a cost-effective conductive connection or through-contacting from the surface to all the stacked inlay layers is not possible using the standard methods. The respectively more remote layers would be able to be connected for high currents and/or heat dissipation only with difficulty and in a cost-intensive manner.

Many modern electronic components, for example transistors, are designed so that they can emit their heat into the conductor tracks via the electrical contacts. In inlay technology, there is the problem that, although the heat can be emitted into the thick copper of the inlay very well, thermal energy is then stuck in the inside of the generally thermally insulating printed circuit board, which consists, for example, of glass fiber composite material. This heat then has to be dissipated out of the inlay in a complex manner.

With respect to heat dissipation, US 2001/0038310 A1, which is incorporated by reference herein, describes a heat sink, which is connected to the circuit board and base plate of a power transistor module. However, there is the problem that, although many power components are approved for increased temperatures, conventional ICs and standard components like resistors, which, for example, may not exceed 85° C., are likewise generally located on the printed circuit board. However, the latter are usually located on a cooling path and closer to a heat source than to a cooling arrangement. Therefore, these components heat up to a higher degree than if the cooling arrangement were located directly at the heat source. Technically, this usually requires higher dimensioning of the cooling arrangement.

US 2012/0236500 A1, which is incorporated by reference herein, discloses a circuit board with power component parts that is isolated by way of an electrically insulating resin-like material from a line through which cooling liquid flows.

It must be noted, in the case of a printed circuit board with inlays, that the thickness of the printed circuit board increases enormously since conductors and components have to be stacked on one another and no crossovers can occur for each inlay layer.

SUMMARY OF THE INVENTION

Described herein is a method for dissipating heat from power electronics circuits on a printed circuit board, and in particular the conductor tracks thereof, as well as a correspondingly designed printed circuit board.

According to one aspect, in a method for cooling power electronics circuits a printed circuit board is produced according to a prescribed circuit board process and is populated with at least one power electronics component, wherein at least one location on at least one metallic conductor track running on a surface of the printed circuit board and comprising at least one metal element, which is both electrically conductive and heat-conductive and the physical height of which is designed to be at least as large as that of the at least one power electronics component, is contact-connected, and wherein a cooling plate is placed in a substantially planar manner, that is to say without noticeable inclination or noticeable elevations, depressions or curvatures, onto the at least one power electronics component and/or the at least one metal element.

Owing to the metal element contact-connected at selected locations on the conductor track, a high current conductivity, a high heat conductivity and a high heat capacitance is provided locally, wherein current is preferably transported perpendicularly to a direction of the heat transport. This is in contrast with previous implementations of heat sinks placed directly on the printed circuit board, which do not conduct current and serve only to dissipate heat.

Through one embodiment of the method according to aspects or the invention, a high-current line and power electronics components are combined in one plane, in particular at the surface, wherein the respective physical heights are not added together. A further advantage of the method according to aspects of the invention is that the printed circuit board can be produced in a circuit board process known from the prior art. The prior art also provides known methods for populating the printed circuit board with the at least one metal element and the at least one power electronics component.

In one embodiment of the method according to aspects of the invention, a layer thickness for the conductor tracks is selected in the circuit board process from the following list: 18 µm, 35 µm, 70 µm, 105 µm, 210 µm, 360 µm. The above list is not intended to exclude other layer thicknesses here but serves merely to cite conventional layer thicknesses in a manufacturing process according to the prior art. For example, the respective layer thicknesses can be produced in a photochemically structured, wet-chemical etching method, wherein thinner layer thicknesses permit correspondingly higher resolutions for small structures in the case of ICs or integrated circuits.

The method according to aspects of the invention thus makes it possible, on the one hand, owing to the applicability of the respective circuit board process known from the prior art, to achieve a high resolution for the conductor tracks for control ICs or for various transistors, for example the terminal of a gate pin can be very fine. On the other hand, owing to one embodiment of the method according to aspects of the invention, selected conductor tracks, for example those to power electronics components, can be strengthened locally on the surface of the printed circuit board.

In contrast to busbars from the prior art, however, the at least one placed metal element is not arranged vertically, but forms a planar surface at at least one location. As a result thereof, a contact face to the cooling plate is produced. A respective metal element can be obtained in the desired shape by punching or water jet cutting or milling or laser cutting.

Specifically in modern power electronics circuits based on circuit boards, in addition to a current line, central heat sources are provided by the at least one power electronics component, for example a transistor, by contact locations or by connection locations, for example to a power supply. In one embodiment of the method according to aspects of the invention, the at least one power electronics component and the at least one metal element used for current conduction are cooled at the same time by means of the cooling plate and so is the printed circuit board. The printed circuit board usually contains further electronic components, such as resistors, capacitors and ICs, which tolerate significantly lower limit temperatures than the power electronics components. In the prior art, in which, for example, only the transistors are cooled directly, in contrast, the transistors at the same time also emit heat to the printed circuit board by way of their contacts, as a result of which said printed circuit board heats up to higher temperatures than the cooled transistors. Although the usual design of transistors is merely with cooling from a respective power connection on the bottom side of the printed circuit board, the cooling can be supported by thermal contact-connection at a top side of the transistor.

In one embodiment of the method according to aspects of the invention, an identical physical height to that of the at least one power electronics component is selected for the at least one metal element.

In one embodiment of the method according to aspects of the invention, a larger physical height is selected for the at least one metal element than that of the at least one power electronics component. The cooling plate lying in planar fashion in this case cools the at least one metal element alone, that is to say without being in thermal contact with a power electronics component.

In a further embodiment of the method according to aspects of the invention, the at least one metal element placed at a location is divided into sections. This is necessary, in particular, when the at least one metal element is of an elongated shape. Long metal pieces on the top side of the printed circuit board tend to a different linear extension, for example upon heating or cooling, than a printed circuit board substrate. In this case, it should be noted that mounting, at least during a soldering process, takes place even at increased temperatures. It is therefore advantageous to divide a respective metal element of elongated form into two or more sections. As a side effect, a smaller production size also reduces a possible material offcut waste. During mounting, the sections then have a certain gap between one another in the longitudinal direction in order to compensate for thermally caused linear extensions. If required, there is also intended to be sufficient access for the contact-connection to the metallic conductor track lying below the sections, for example in a galvanic manner or by way of a soldering process. To prevent high current densities in the gap in the thin conductor track on the printed circuit board, it is advantageous to shape the gap arising in the longitudinal direction through stretching or suitable shaping in the transverse direction. In this respect, see also FIG. 3. Therefore, on the one hand, an effective resistance is reduced through widening of the current path. On the other hand, it is possible to utilize the fact that the tolerance in the longitudinal direction is higher than in the transverse direction on account of the extension. For this reason, the spaces can be kept shorter in the transverse direction and a current path length decreases again to the benefit of a lower resistance.

In one embodiment of the method according to aspects of the invention, the cooling plate is selected either as a metal plate through which liquid flows or as a metal piece having a specifically enlarged surface, for example a heat sink, or as a heat conductor. Heat conductors are formed, for example, by heat-conducting plates, graphite elements or also so-called heat pipes.

In a further embodiment of the method according to aspects of the invention, the power electronics circuit is cooled both by a top side and by a bottom side of the printed circuit board. According to aspects of the invention, a first at least one metal element on the top side of the printed circuit board has at least the same physical height as a first at least one power electronics component on the top side of the printed circuit board, exactly like a second at least one metal element on the bottom side of the printed circuit board has at least the same physical height as a second at least one power electronics component on the bottom side of the printed circuit board.

In one embodiment of the method according to aspects of the invention, to offset slight differences in the physical height between the at least one power electronics component and the at least one metal element, at least one gap pad is positioned at a contact face to the cooling plate. The at least one gap pad advantageously has a high thermal conductivity. Furthermore, said gap pad is formed from a flexible material, as a result of which low height differences between individual components contact-connected by the cooling plate are offset and mechanical stresses are prevented.

In a further embodiment of the method according to aspects of the invention, the at least one metal element is designed as projecting beyond a surface area of the conductor track contact-connected by said metal element. In another further embodiment of the method according to aspects of the invention, the part of the metal element projecting beyond a surface area of the conductor track is used to mount the printed circuit board. Advantageously, connection locations and/or screw locations are provided at at least two sides of the printed circuit board at respective metal elements projecting beyond the printed circuit board, at which connection locations and/or screw locations an electrical connection to external terminals is carried out and/or a mechanical securing of the circuit board within a battery housing is performed. In particular, the mechanical securing by means of a respective projecting metal element serves so that a printed circuit board material, for example glass fiber reinforced plastic, GFRP for short, is not thermally or mechanically damaged by a contact pressure. Advantageously, screws whose physical height in the screwed state does not exceed the physical height of the circuit board including cooling plate are used to screw the circuit board to the battery housing. Advantageously, the projecting metal elements can also be welded or soldered to connection locations in the battery housing. A respective metal element can also be exposed by window milling into the printed circuit board, if the respective metal element has already been installed on the circuit board. Mounting by means of a press-fit connection is also conceivable.

In one embodiment of the method according to aspects of the invention, either copper or aluminum is selected as the material for the at least one metal element. However, the method according to aspects of the invention is also applicable when another conductor material is selected. Copper and aluminum advantageously provide high thermal and electrical conductivity. Copper, and copper-aluminum laminates in the case of copper as the surface to be contact-connected, can be used directly as the material. Where necessary, process steps for surface oxide removal have to be carried out, such as, for example, deburring, grinding, pickling and many more. Aluminum, and copper-aluminum laminates in the case of aluminum as the surface to be contact-connected, can likewise be used directly as the material with the exception of soldering processes. For soldering processes, it is advantageous to cover the aluminum with a solderable metal, for example electrochemically by galvanization after the preceding pickling.

In one embodiment of the method according to aspects of the invention, the contact-connection of the at least one metal element with the conductor track is caused either by soldering, for example with soldering paste in a reflow process, or by pinning, for example advantageously by means of press-fit connection, or by riveting. The printed circuit board can be populated with the at least one metal element either after other electrical components have been mounted or at the same time as them. Therefore, the printed circuit board can be populated as is conventional and the solder can also be applied as a paste using screen printing without other components being in the way.

In general, an electrical and thermal contact-connection of the circuit board to the components is necessary. This generally takes place by way of contact-connection via the structured conductor tracks of the printed circuit board. Electrical contact-connection, which also simultaneously physically produces thermal conduction through electronic heat transport, should take place where the introduction of current and heat from a conductor track of the printed circuit boards is to be expected. Therefore, extensive contact-connection on the entire bottom side of a respective metal element does not have to take place, at least, however, at those locations at which current is intended to flow into or out of the metal element.

Furthermore, according to another aspect of the invention, a printed circuit board is populated with at least one power electronics component, which furthermore has at least one metal element at at least one location on at least one metallic conductor track running on a surface of the printed circuit board, the physical height of said metal element being at least as large as that of the at least one power electronics component, and which comprises a cooling plate, which is placed in a planar manner onto the at least one power electronics component and/or the at least one metal element.

In a refinement of the printed circuit board according to aspects of the invention, the conductor tracks have a layer thickness selected in the circuit board process from the following list: 18 µm, 35 µm, 70 µm, 105 µm, 210 µm, 360 µm.

In a further refinement of the printed circuit board according to aspects of the invention, the at least one metal element placed at a location comprises a plurality of sections.

Finally, in another further refinement of the printed circuit board according to aspects of the invention, it additionally has a gap pad between the cooling plate and the at least one power electronics component and/or the at least one metal piece.

BRIEF DESCRIPTION OF THE DRAWING

Further advantages and configurations of invention emerge from the description and from the appended drawing.

It is self-evident that the features mentioned above and the features yet to be discussed below may be used not only in the respectively specified combination but also in other combinations or individually without departing from the scope of the present invention.

DETAILED DESCRIPTION OF THE INVENTION

Figure 1:
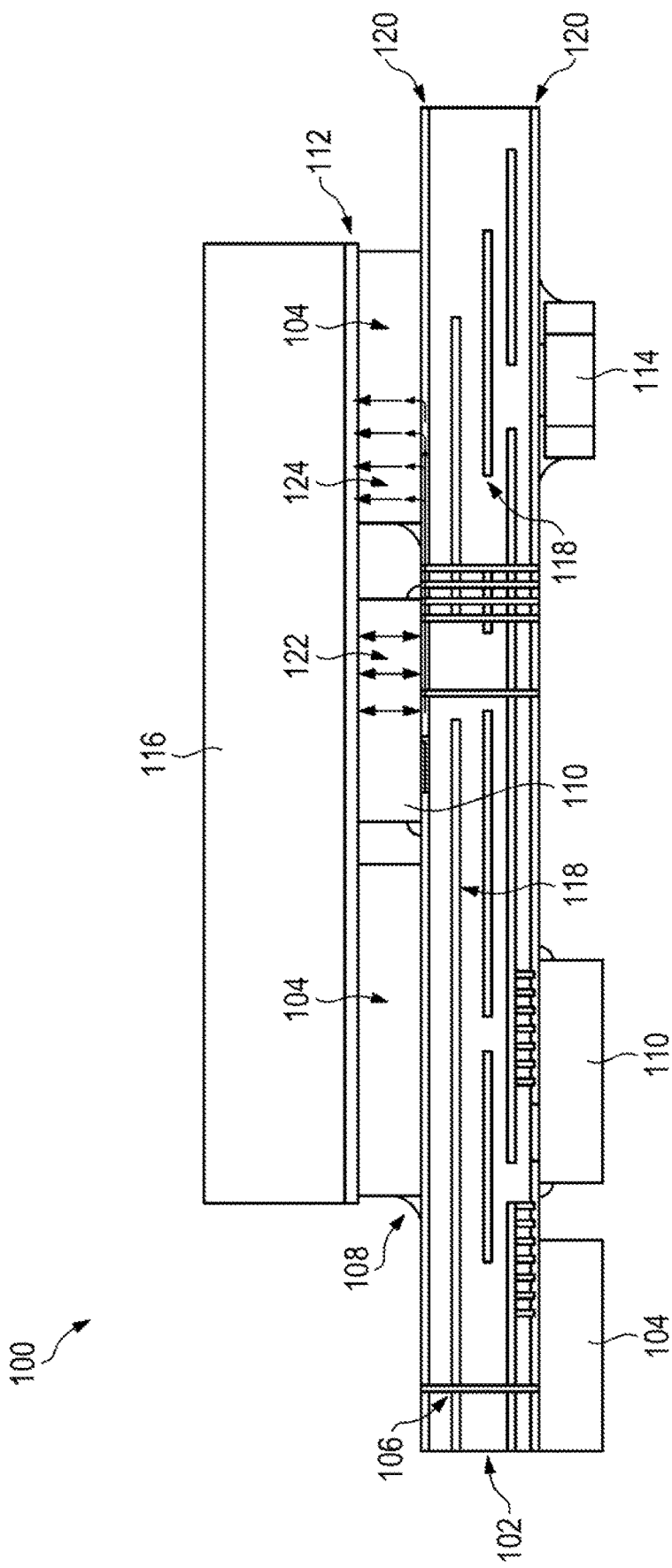
FIG. 1 shows a schematic illustration of a section through an embodiment of the printed circuit board according to aspects of the invention.

FIG. 1 shows a schematic illustration of a section 100 through a printed circuit board according to aspects of the invention. A circuit board 102 has inner metallic conductor tracks 118 and, on both surfaces, metallic conductor tracks 120, which run horizontally and can be connected in the vertical direction by means of metallic vias 106. The circuit board 102 is populated on a top side and a bottom side with electronic components, for example shown with a plurality of metal elements 104 and power electronics components 110, and with a capacitor 114 as an example of other components. A respective metal element 104 is situated on a conductor track 120 running on a respective surface of the circuit board 102. Said metal element has a flat top side and has a similar physical height to a respective power electronics component 110. By way of example, said metal element is connected to the circuit board 102 at a location 108 by solder. The power electronics component 110, which may be, in particular, a power semiconductor switch, generates heat during operation, said heat being able to pass at a top side and a bottom side of the power electronics component 110 to adjoining components, indicated by the double arrow 122 representing a heat path. The heat passes to the conductor track 120 at the top side of the circuit board 102. Since the conductor track 120 as a metal generally has a high heat conductivity, the heat spreads horizontally on the circuit board 102 along the conductor track 120, for example to the metal element 104 characterized with a single arrow 124, said metal element absorbing heat and being able to dissipate it according to aspects of the invention via the top side thereof to a suitably arranged cooling plate 116. A gap pad 112 is situated on the top side of the two metal elements 104 and of the power electronics component 110 on the top side of the circuit board 102, said gap pad 112 providing, for the cooling plate 116 located above same, a mechanical tolerance compensation of low physical thickness differences between the components and having a high heat conductivity. The cooling plate 116 may be a liquid cooling plate, a cooling conductive element or a heat sink.

Figure 2:
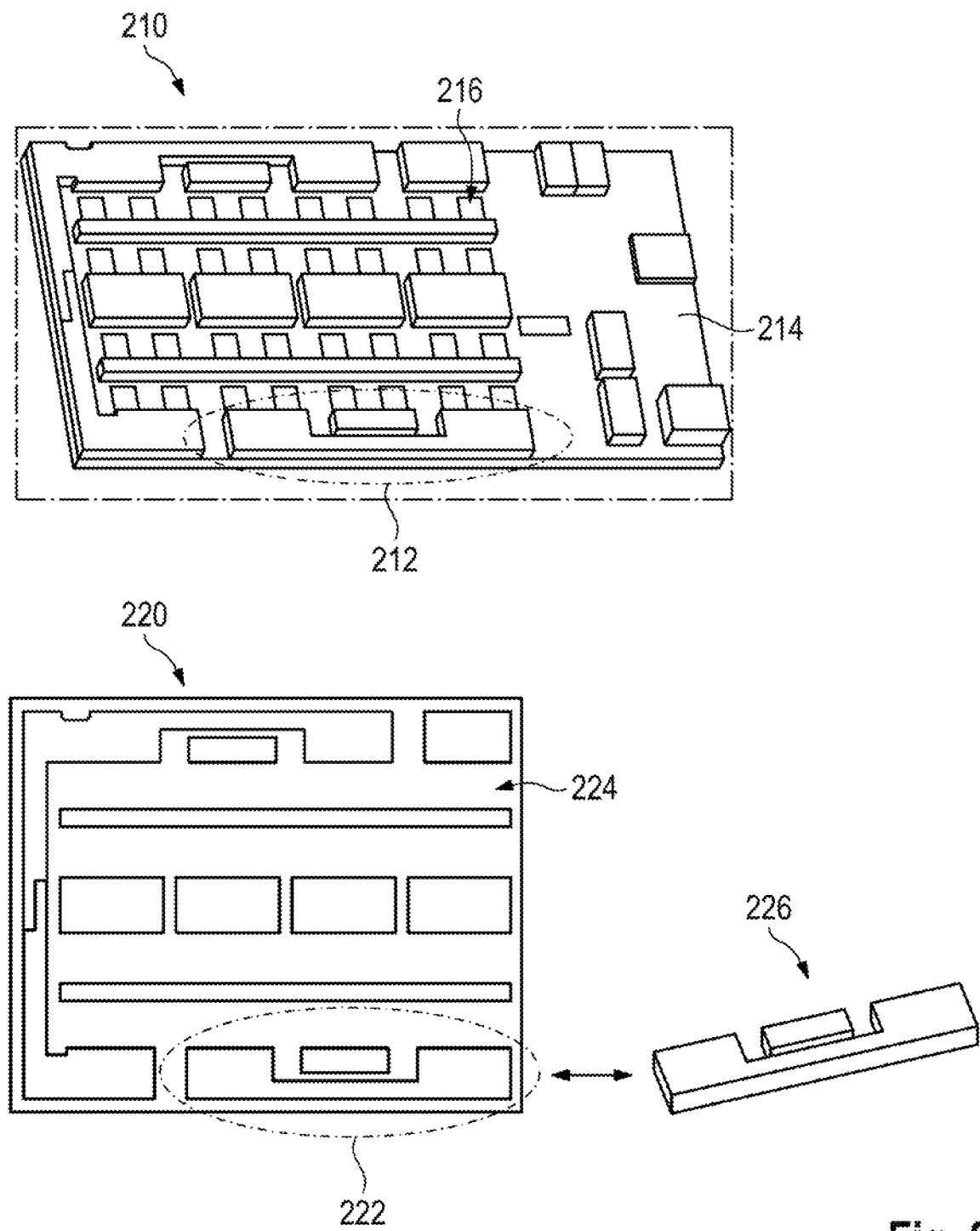
FIG. 2 shows a schematic illustration of a plurality of metal elements formed in embodiments of the method according to aspects of the invention for an embodiment of the printed circuit board according to aspects of the invention.

FIG. 2 shows a schematic illustration of a plurality of metal elements for the printed circuit board. View 210 shows a perspective illustration of the printed circuit board 214, which is populated, inter alia, with a plurality of power electronics components, for example that with reference sign 216 and metal elements 212. The metal element 212 is obtained, for example, by stamping the region 222 out of the sheet metal 224 in view 220. The sheet metal 224 in this case has the desired physical height of the metal element, visible in the perspective illustration 226.

Figure 3:
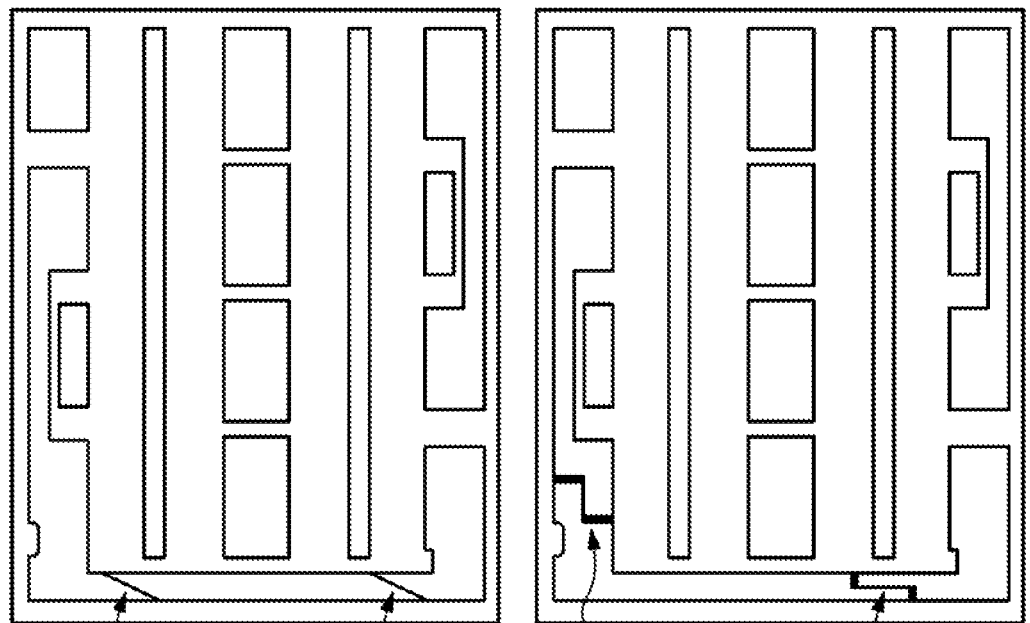
FIG. 3 shows a schematic illustration of a plurality of templates for metal pieces to be stamped in embodiments of the method according to aspects of the invention and, where appropriate, the sections thereof.
Figure 3:
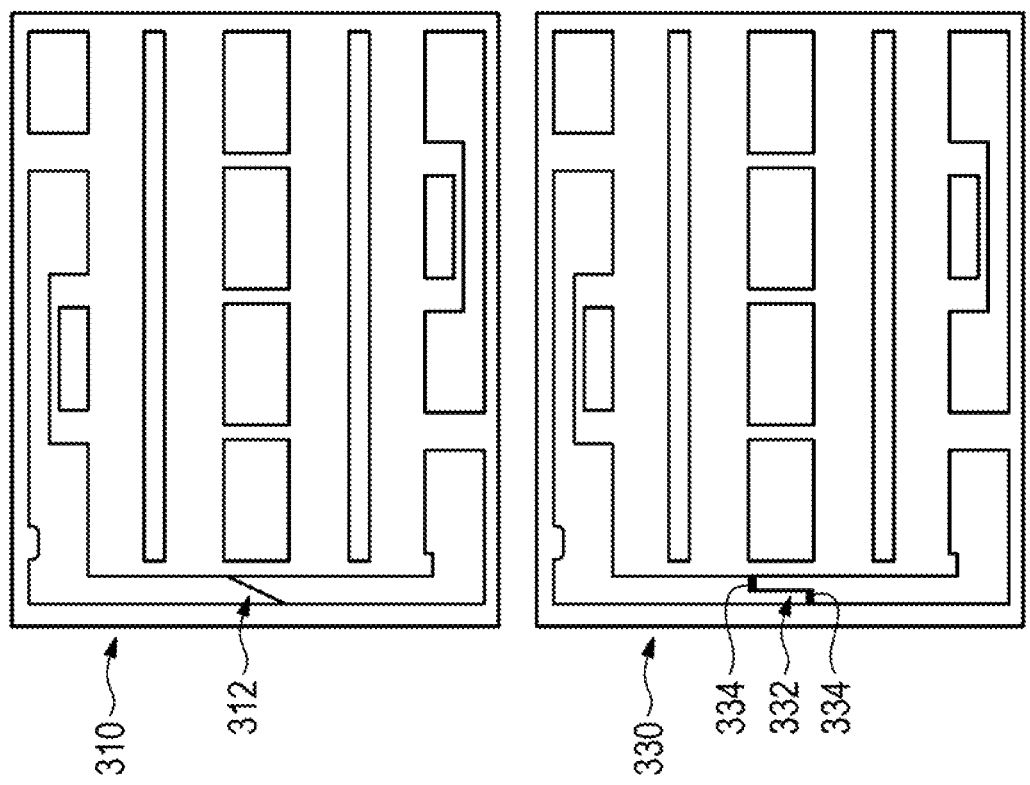

FIG. 3 shows a schematic illustration of a plurality of templates for metal pieces to be stamped and, where appropriate, the sections thereof. In particular, options for forming a gap in the case of elongate metal elements are illustrated. Owing to heat-related material expansion, for example during mounting by way of soldering, at least a certain gap should be present in the longitudinal direction between sections in order to compensate for changes in length and/or to make possible, if required, sufficient access for contact-connection of the printed circuit board metallization located below. Views 310 and 320 each show a respective oblique profile of the gap 312 and of the two gaps 322. In view 330, the stepped gap 332 has wider spaces 334 in the longitudinal direction than the space perpendicular thereto. In view 340, two gaps 342 and 344 also each have wider spaces in the longitudinal direction than the respective space perpendicular thereto.

Figure 4:
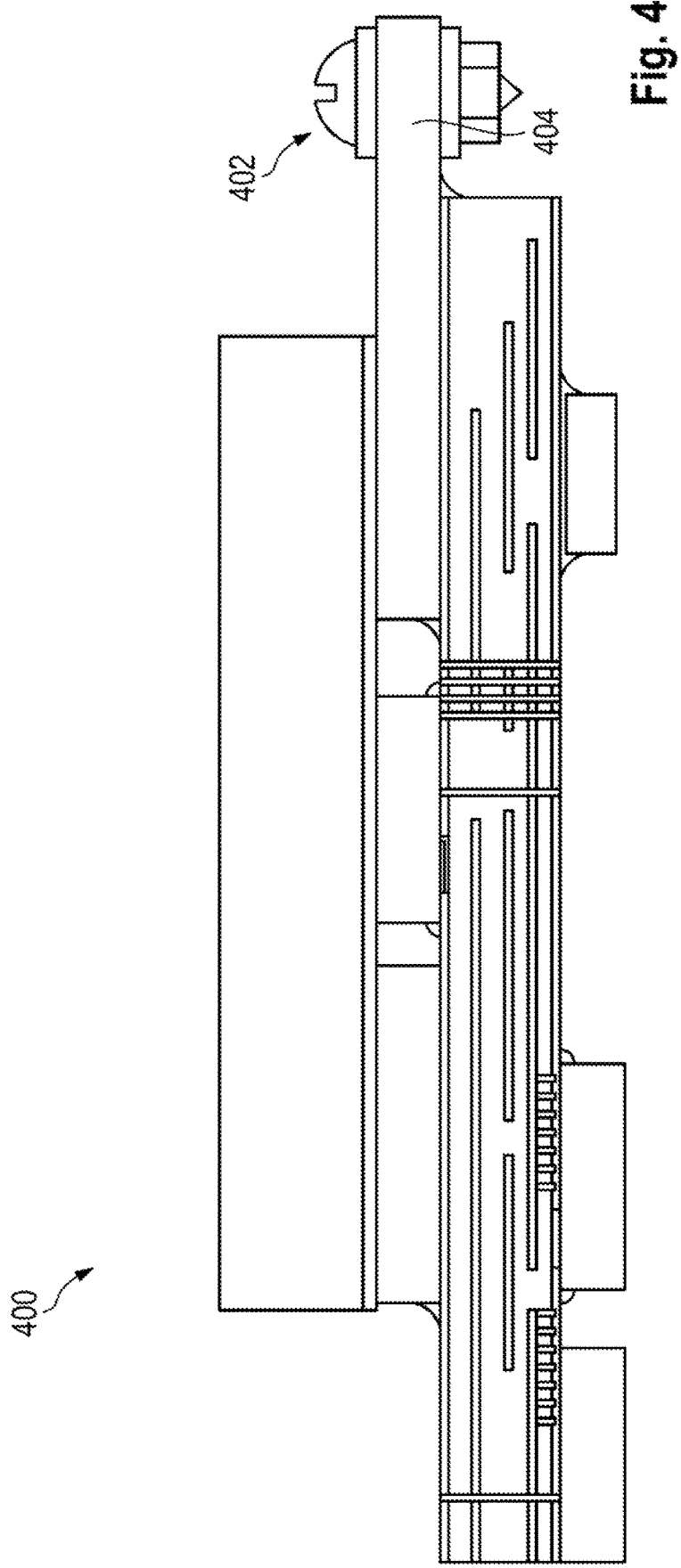
FIG. 4 shows a schematic illustration of a section through an embodiment of the printed circuit board according to aspects of the invention with a mounting example at a metal element projecting beyond the printed circuit board in one embodiment of the method according to aspects of the invention.

FIG. 4 shows a schematic illustration of a section 400 through a printed circuit board according to aspects of the invention with a mounting example at a metal element 404 projecting beyond the printed circuit board in one embodiment of the method according to aspects of the invention. A bore is installed in the metal element 404 projecting beyond the printed circuit board, through which bore a screw 402 produces a mechanical is connection with a bracket of the printed circuit board. The bracket can be located, for example, in a battery housing. Advantageously, the screw 402 in this case does not project beyond the inventive arrangement of power electronics components and low physical height brought about in the same plane.

Figure 5:
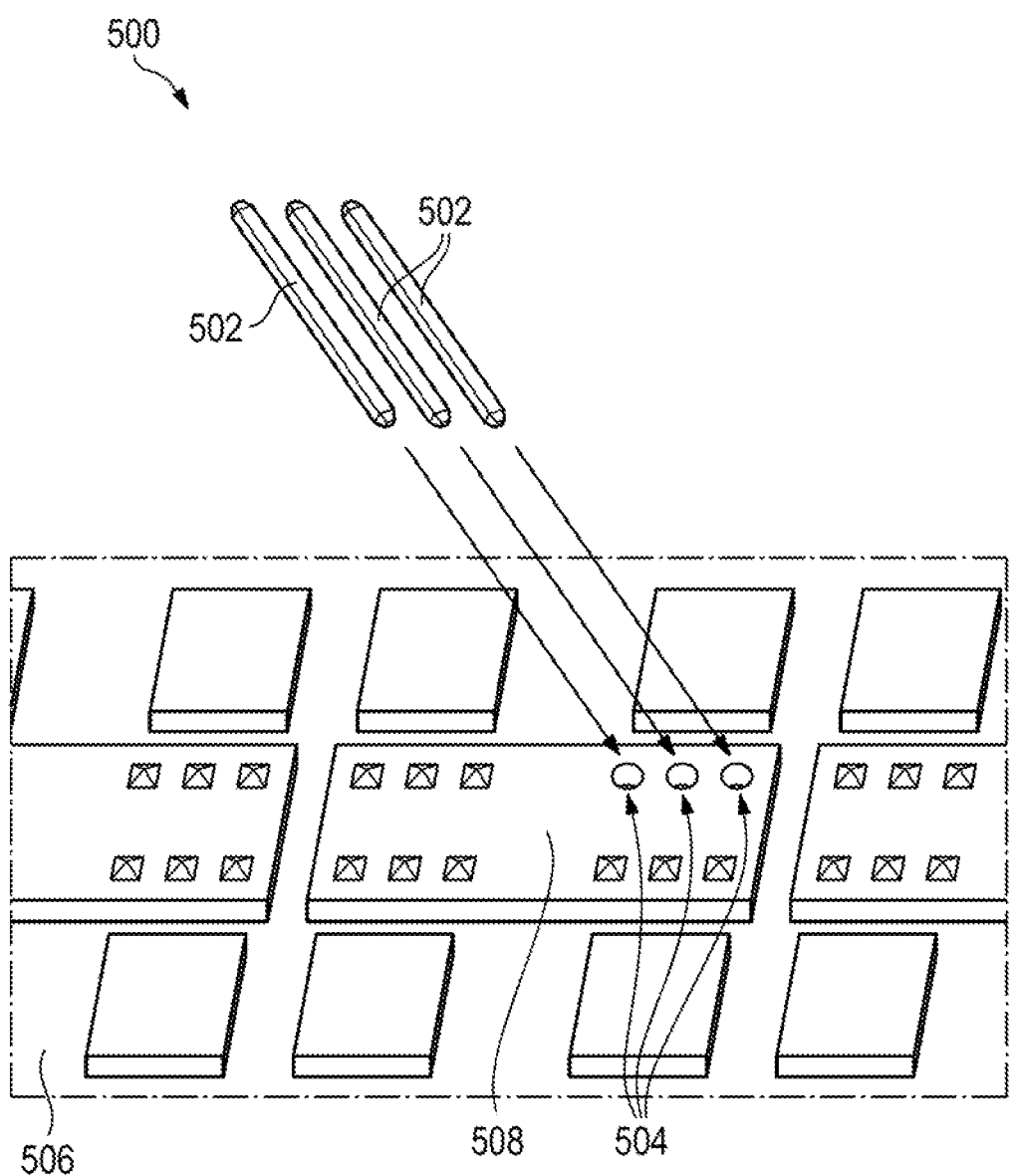
FIG. 5 shows a schematic illustration as a perspective view of pinning of the metal element on the printed circuit board for one embodiment of the method according to aspects of the invention.

FIG. 5 shows a schematic illustration as a perspective view 500 of pinning of the metal element 508 on the printed circuit board 505 for one embodiment of the method according to aspects of the invention. The pinning takes place through the printed circuit board in the vertical direction so that the metallic conductor tracks of the printed circuit board 506 and the metal element 508 are contact-connected. Here, additional soldering is also conceivable but also as an alternative thereto the contact-connection by press-fit connection, which tolerates or even requires cold welding. A press-fit connection can be implemented here, for example, in such a way that pins 502 with an angular cross section can be driven into holes 504 with round cross sections so that the edges of the pins 502 cut into the corresponding conductors. The pins 502 are in this case driven into the metal element 508 so deep that they do not protrude at the surface to be cooled. Generally, the pins 502 have a dual function, specifically firstly to ensure mechanical connection and secondly to bring about minimum current conduction, which can be supported, where necessary, by additional contact areas between the metallic conductor tracks on the printed circuit board 506 and the metal element 508. In particular, a press-fit connection has the advantage that, for the case of the metal element 508 having been formed from aluminum, a secure contact-connection can be produced.

Figure 6:
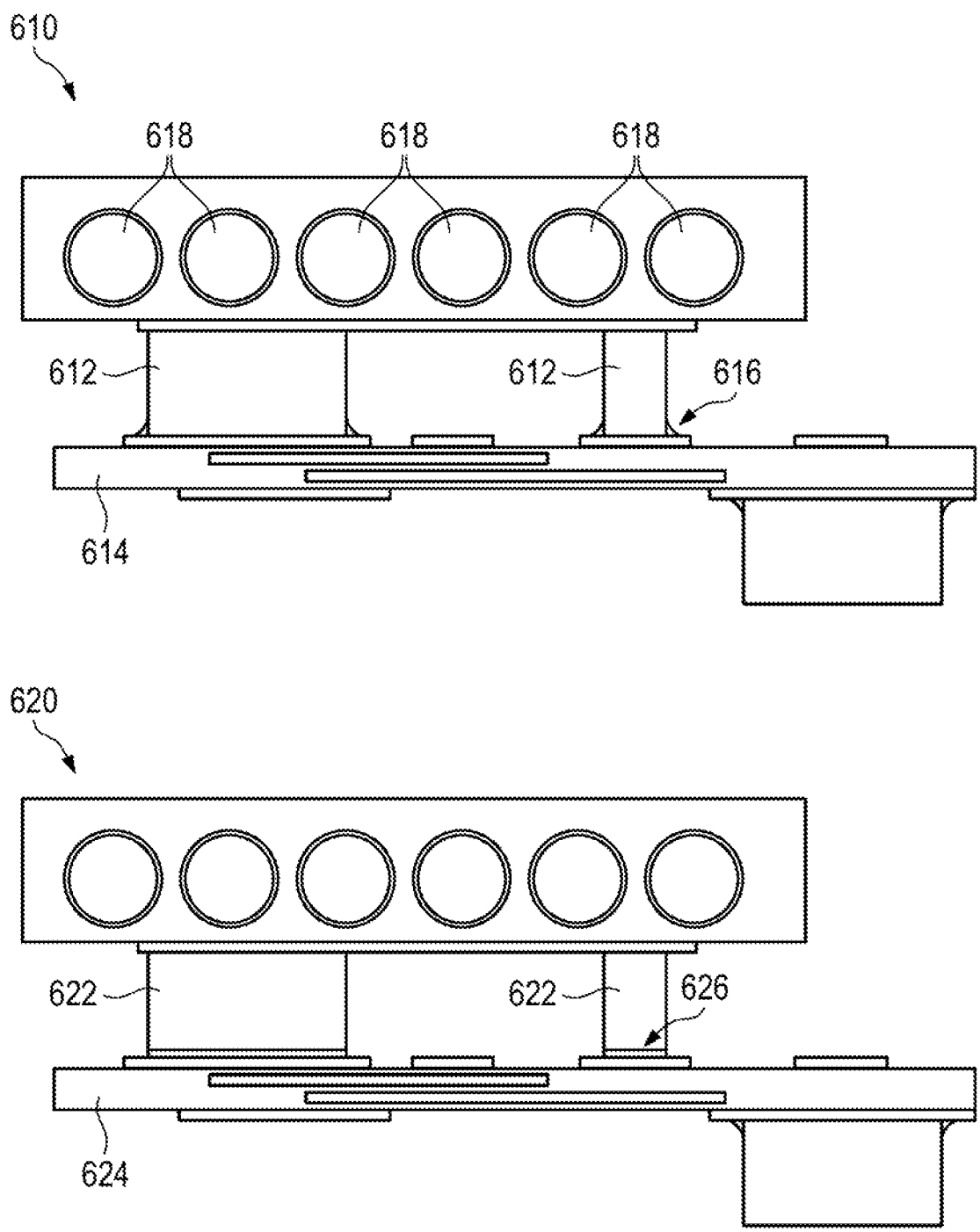
FIG. 6 shows a schematic illustration of two sections through a printed circuit board according to aspects of the invention using different soldering processes for one embodiment of the method according to aspects of the invention.

FIG. 6 shows a schematic illustration of two sections in view 610 and 620 through a printed circuit board 614 and 624 respectively according to aspects of the invention using different soldering processes for one embodiment of the method according to aspects of the invention. View 610 shows two metal elements 612, which are contact-connected by means of soldering along an edge formed by the respective metal element 612 with the respective conductor track of the printed circuit board 614, for example at the location denoted by the reference numeral 616. In view 620, the soldering 626 is located between the two metal elements 622 and the respective conductor track of the printed circuit board 624. A cooling plate, in this case embodied as a liquid cooling plate with liquid channels 618, is located placed on the respective metal elements of both views 610 and 620. Generally, soldering preferably involves extensive soldering connection between the bottom side of the metal element and the conductor track or else a conductor pad of the printed circuit board, as also occurs in a similar manner in the case of SMD components. For this purpose, the metallic conductor track lying therebelow has to be at least partly uncovered by solder resist, that is to say to form a type of pad on which it is possible to solder. In the case of reflow soldering, the pads of the printed circuit board, or parts of the pads, to which the metal elements are intended to be attached are pasted. Where necessary, adhesive is also applied between the pads to fix the metal elements. The metal elements are then positioned, wherein the two processes of pasting and positioning can take place either simultaneously or separately to the mounting of other components. The soldering paste is also melted in an oven. In other soldering methods, such as, for example, wave soldering, the metal elements are fixed, for example, by means of adhesive, and a soldering joint is produced at the interfaces between the metal element and the pad of the printed circuit board. Advantageously, additional surfaces can be created here through drilled holes or indentations.

Figure 7:
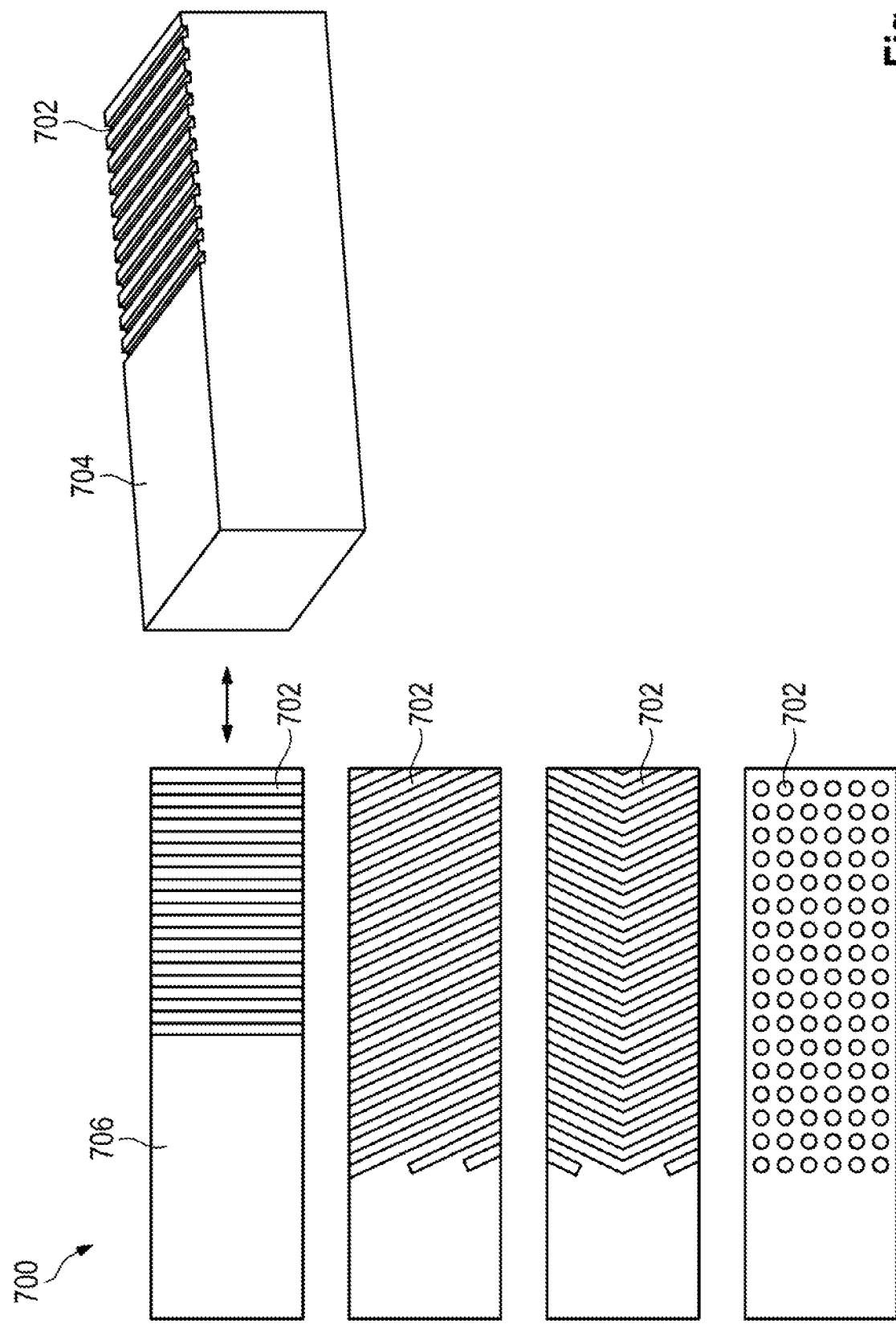
FIG. 7 shows a schematic illustration of various profiles of the bottom side for soldering a metal element for one embodiment of the method according to aspects of the invention.

FIG. 7 shows a schematic illustration 700 of various profiles 702 of the bottom side for soldering a metal element 704 and 706 for one embodiment of the method according to aspects of the invention. If the soldering is intended to take place on the bottom side of metal elements over a large area, a smooth surface property of said bottom side may be problematic. Typical soldering pastes contain solvents and flux material, which release gas during soldering or leak from a molten mass onto the nearest surface. When this surface is not available, inclusions disadvantageously form in a region in which a neat soldering connection is necessary. For large-area soldering connections, the surfaces of the bottom side of the metal element can accordingly undergo surface structuring in order either to provide paths for discharging the aforementioned solder constituents or to form at least pockets in a mold that do not unnecessarily reduce the cross-sectional area of the transition between the metallic conductor track of the printed circuit board and the metal element. Production can be carried out very quickly by way of milling by virtue of the metal element being led past a milling head with an appropriate pattern. As an alternative, holes or vias can be placed in a dense grid on the surface of the circuit board. Holes like vias are preferably metallized in a standard printed circuit board process. Preferred diameters for application in one embodiment of the method according to aspects of the invention are smaller than or equal to 0.4 mm. Said vias can, for example, be drilled mechanically or be cut with a laser, referred to by those skilled in the art as laser-drilled vias or also as microvias. Furthermore, said vias may be blind holes, for example tapered conically inward, or continuous holes.

Figure 8:
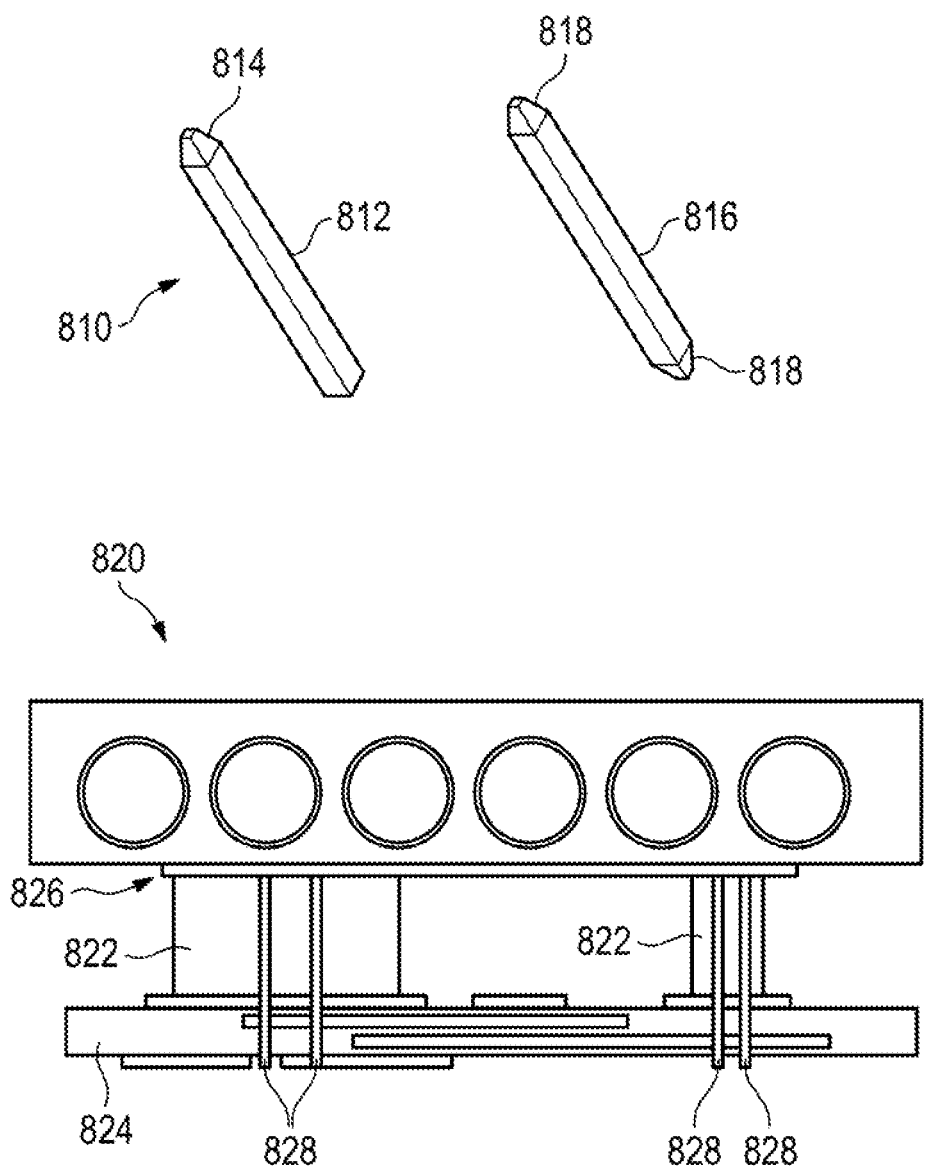
FIG. 8 shows a schematic illustration of two examples for pins and a section through a printed circuit board according to aspects of the invention with installed pins.

FIG. 8 shows a schematic illustration of two examples for pins 12 and 816, shown in perspective in view 810, and a section 820 through a printed circuit board according to aspects of the invention with installed pins 828. The pin 812 has only one conical end 814 by way of which it is driven forward into a component, while pin 816 is pointed conically at both ends 818. In section 820, it can be seen that, for placing the cooling plate on a gap pad 826, the respective pins 828 have been driven so far through the metal elements 822 and the printed circuit board 824 that a planar surface is produced below the gap pad 326. The gap pad 826 can also have a plurality of gap pad layers and can be seen as optional. Ideally, the gap pad 828 is electrically insulating, but has a thermal conductivity of, for example, greater than 3 A/(K m).

Figure 9:
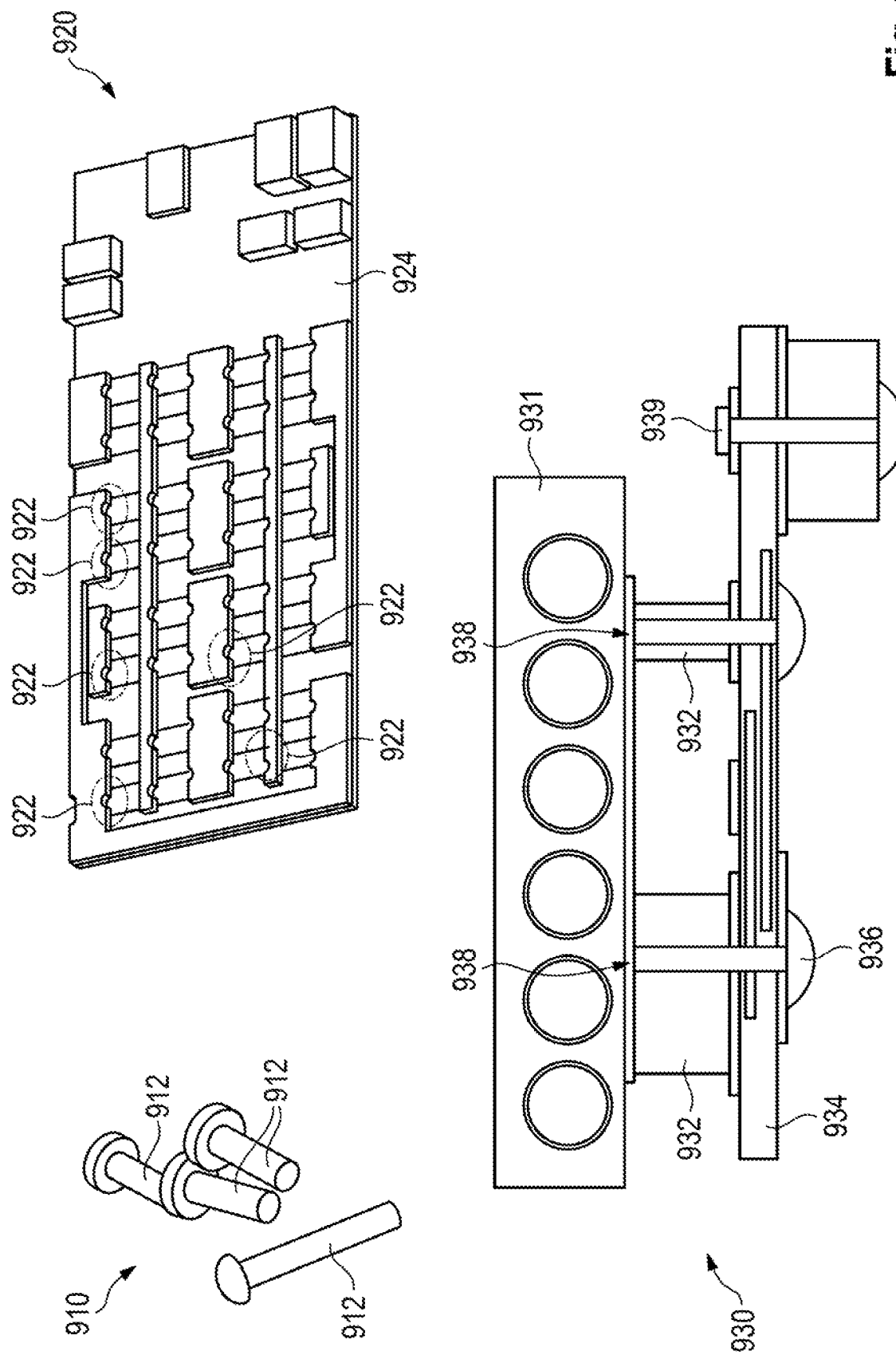
FIG. 9 shows a schematic illustration of an assembly using rivets for one embodiment of the method according to aspects of the invention.

FIG. 9 shows a schematic illustration of an assembly using rivets for one embodiment of the method according to aspects of the invention. The perspective view 910 shows a plurality of rivets 912 used for mounting. The perspective view 920 illustrates a printed circuit board 924 with bores 922 prepared for riveting. Finally, the section 930 through a printed circuit board 934 according to aspects of the invention shows mounting of two metal elements 932 by rivets 938. The rivet head 936 is situated in this case on a conductor track on the bottom side of the printed circuit board 934. Like in the aforementioned pinning, care must be taken to ensure that the respective rivets 938 terminate in a planar manner with the top side of the respective metal element 932 in order that the cooling plate 931 can be placed in a planar manner. Mounting using rivets 912 is similar here to the pinning. However, secure mechanical contact is not produced by the press-fit connection but instead, for example, by soldering, for example soft or hard soldering to the metallic conductor track of the printed circuit board, or preferably to a metal piece on the opposite side, or by welding, for example spot welding, ultrasonic welding, possibly also TIG, MIG, MAG, laser welding, or else by caulking on the opposite side, possibly using a counterpiece 939 on the rear side as a counterbearing or washer. Compared to pins, rivets generally offer the advantage of a significantly greater cross section of an individual rivet. While in the case of pins a plurality of pins are preferably intended to be positioned, if required, an individual rivet per connection may be sufficient.

Figure 10:
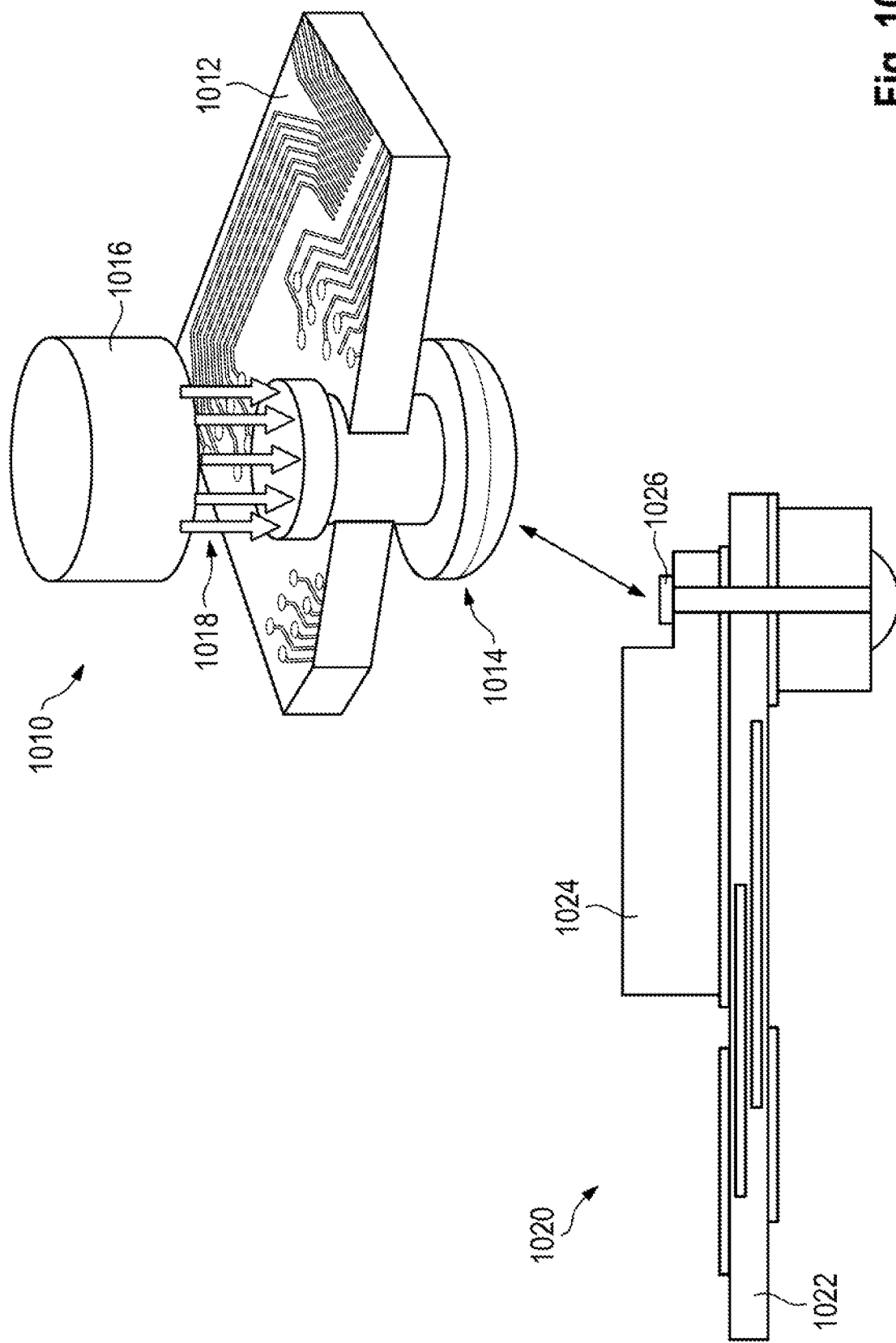
FIG. 10 shows a schematic illustration of caulking during riveting for one embodiment of the method according to aspects of the invention.

FIG. 10 shows a schematic illustration of caulking during riveting for one embodiment of the method according to aspects of the invention. The perspective view 1010 shows placement 1018 of the counterpiece 1016 on the rivet 1014 inserted in a bore of the printed circuit board 1012. The section 1020 through a printed circuit board 1022 according to aspects of the invention shows the placed counterpiece 1026 on a metal element 1024, which has been depressed to mount the counterpiece 1026.

Figure 11:
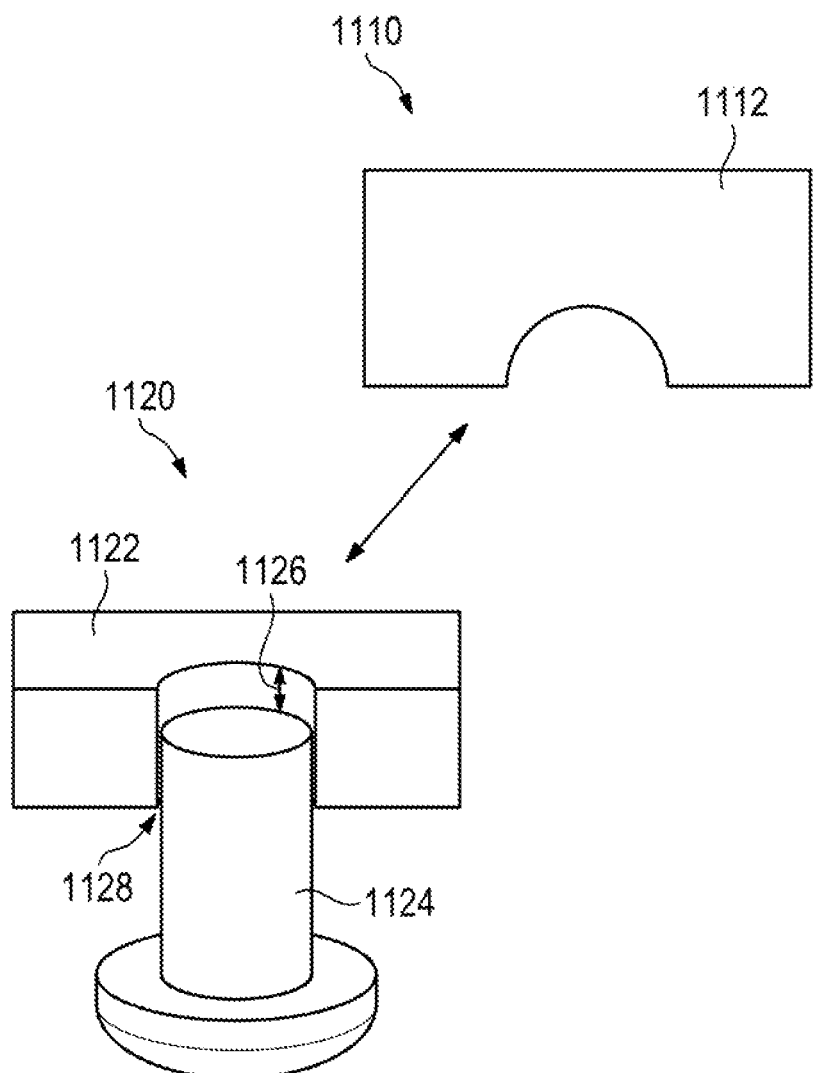
FIG. 11 shows a schematic illustration of possibilities for soldering the rivet for one embodiment of the method according to aspects of the invention.

FIG. 11 shows a schematic illustration of possibilities for soldering the rivet for one embodiment of the method according to aspects of the invention. View 1110 shows a plan view of the metal element 1112 to be riveted. For the purpose of illustration, it has been shown as halved. The perspective view 1120 shows that the rivet 1124 is not inserted fully into the metal element 1122 but instead a free space of the height 1126 remains, which can hold solder for the purpose of the soldering. Furthermore, when inserting a thinner rivet than a diameter of the bore in the metal element 1122 would require, a gap 1128 remains, which can likewise hold solder.

What is claimed is:

1. A method for cooling power electronics circuits on a printed circuit board including at least one power electronics component; at least one electrically conductive and heat-conductive metal element having a physical height that is at least as large as that of the at least one power electronics component, and at least one metallic conductor track running on a surface of the printed circuit board and upon which the at least one power electronics component and the metal element: are mounted, said method comprising:

a plurality of vertical metallic vies passing through a thickness of the printed circuit board, where no vertical metallic vies are positioned beneath the at least one metal element, and contact connecting the at least one metal element to a location on the at least one metallic conductor track, and positioning a cooling plate in a planar manner onto (i) the at least one power electronics component, and (ii) the at least one metal element, and positioning a single unitary flexible gap pad in collective contact with the cooling plate; the at least: one metal element and the power electronics component in order to offset differences in the physical height between the at least one power electronics component and the at least: one metal element as well as transfer thermal energy between the metal element, the power electronics component and the cooling plate, wherein the single unitary flexible gap pad spans between the at least one metal element and the power electronics component.

2. The method as claimed in claim 1, in which a layer thickness for the conductor tracks is 18 μm, 35 μm, 70 μm, 105 μm, 210 μm, or 360 μm.

3. The method as claimed in claim 1, wherein the at least one metal element has a larger physical height than that of the at least one power electronics component.

4. The method as claimed in claim 1, in which the at least one metal element is divided into sections.

5. The method as claimed in claim 1, in which the cooling plate is (i) a metal plate through which liquid flows, (ii) a metal piece having an enlarged surface, or (iii) a heat conductor.

6. The method as claimed in claim 1, in which the power electronics circuit is cooled both on a top side and on a bottom side of the printed circuit board.

7. The method as claimed in claim 1, in which the at least one metal element projects beyond a surface area of the conductor track contact-connected by said metal element.

8. The method as claimed in claim 7, in which the part of the metal element projecting beyond the surface area of the conductor track is used to mount the printed circuit board.

9. The method as claimed in claim 1, in which the at least one metal element is composed of either copper or aluminium.

10. The method as claimed in claim 1, in which a contact-connection of the at least one metal element with the conductor track is caused either by soldering, pinning or riveting.

11. The method as claimed in claim 1, in which the at least one power electronics component and the metal element are directly mounted to the at least one metallic conductor track running on the surface of the printed circuit board.

12. The method as claimed in claim 1, wherein the at least one metal element does not actively produce heat.

13. A printed circuit board comprising:

at least one metallic conductor track running on a surface of the printed circuit board;

at least one power electronics component mounted to the printed circuit board and positioned on the at least one metallic conductor track;

at least one metal element positioned at at least one location on the at least one metallic conductor track, wherein a physical height of said at least one metal element is at least as large as that of the at least one power electronics component;

a plurality of vertical metallic vias passing through a thickness of the printed circuit board, where no vertical metallic vias are positioned beneath the at least one metal element, and a cooling plate positioned in a planar manner onto (i) the at: least one power electronics component, and (ii) the at least one metal element; and a single unitary flexible gap pad positioned to collectively contact the cooling plate, the at least one metal element and the power electronics component in order to offset differences in the physical height between the at least one power electronics component and the at least one metal element as well as transfer thermal energy between the metal element; the power electronics component and the cooling plate, wherein the single unitary flexible gap pad spans between the at least one metal element and the power electronics component.

14. The printed circuit board as claimed in claim 13, in which the conductor tracks have a layer thickness of 18 μm, 35 μm, 70 μm, 105 μm, 210 μm, or 360 μm.

15. The printed circuit board as claimed in claim 13, in which the at least one metal element comprises a plurality of sections.

16. The printed circuit board as claimed in claim 13, in which the at least one power electronics component and the metal element are directly mounted to the at least one metallic conductor track running on the surface of the printed circuit board.

17. The printed circuit board as claimed in claim 13, in which the gap pad is sandwiched directly between (i) the at least one power electronics component and the metal element, and (ii) the cooling plate.

18. The printed circuit board as claimed in claim 13, wherein the at least one metal element does not actively produce heat.

* * * * *